United States Patent [19]

Lee

[11] Patent Number: 4,657,172
[45] Date of Patent: Apr. 14, 1987

[54] APPARATUS AND METHOD OF SOLDER COATING INTEGRATED CIRCUIT LEADS

[75] Inventor: Jong S. Lee, San Jose, Calif.

[73] Assignee: American Microsystems, Inc., Santa Clara, Calif.

[21] Appl. No.: 794,038

[22] Filed: Oct. 31, 1985

[51] Int. Cl.⁴ .............................................. H05K 3/34
[52] U.S. Cl. .................................. 228/180.2; 228/254
[58] Field of Search .................. 228/180.1, 180.2, 203, 228/208, 254; 427/96

[56] References Cited

U.S. PATENT DOCUMENTS

| 3,726,007 | 4/1973 | Keller | 228/180.2 |
| 4,011,980 | 3/1977 | Dvorak | 228/180.1 |
| 4,139,881 | 2/1979 | Shimizu | 228/180.1 |
| 4,332,342 | 6/1982 | Van Der Put | 228/180.2 |
| 4,390,120 | 6/1983 | Broyer | 228/180.1 |
| 4,515,304 | 5/1985 | Berger | 228/180.2 |

Primary Examiner—Nicholas P. Godici
Assistant Examiner—Kurt Rowan
Attorney, Agent, or Firm—Thomas S. MacDonald; Alan H. MacPherson; Steven F. Caserza

[57] ABSTRACT

Desired control of the thickness and composition of a solder coat on the J-leads of an integrated circuit Quad package is obtained by orienting the packages while being solder coated in a "leads-up" orientation as a series of strips mounting the packages are passed through a solder wave of a wave soldering apparatus on a pallet. The Quad or other shaped integrated circuit or other electronic packages which have leads extending exteriorly thereof, thus have the critical lead crest portions coated with substantially the same solder layer thickness and composition. This permits reliable electrical connections between the crest portions of the leads and printed circuit board metal traces (metallization), particularly in surface mounting of the package to a printed circuit board. An additional feature of the invention is a pallet for holding a series of package-holding elongate frames which pallet is used for conveying the packages through the wave soldering apparatus.

5 Claims, 11 Drawing Figures

APPARATUS AND METHOD OF SOLDER COATING INTEGRATED CIRCUIT LEADS

FIELD OF THE INVENTION

This invention relates to the method of placement of a solder coating on multiple metallic leads extending from an integrated circuit package. More particularly, it is directed to a procedure and multichip pallet for ensuring an essentially constant thickness of a resultant solder layer on critical areas of each of the leads and where the solder layer is essentially homogeneous in composition over the entire solder layer on the multiple leads.

BACKGROUND OF THE INVENTION

In general, in both DIP (dual-in-line package) and plastic leaded chip carriers (PLCC or Quad), solder plating using electrical deposition techniques, have been employed to plate a thin layer of solder, typically 60% tin and 40% lead. However, it has been difficult to obtain uniform deposits over the entire surface of the multiple leads extending from the plastic package. This is particularly so with respect to so-called J-leads, which extend from a midpoint of the four sides of a Quad package and are bent downwardly around the package bottom edge and extend inward to form the bottom of the J. The curved bottom hereinafter is called the lead "crest". Further in solder plating, it is very difficult to control the solder composition being plated over the entire surface of the multiple leads resulting in nominal 60-40 (Sn-Pb) solder having areas of 85%Sn-15%Pb or 80%Sn-20%Pb for example.

A nonuniform thickness of the solder layer at a J-lead crest results in an unreliable joint between that lead when it is to be solder mounted directly on copper traces or conductive pads of a printed circuit board, or the like, in so-called surface-mounted technology. This occurs when an "over thick" layer at one lead crest creates a high point on the desired plane of lead crests forming the overall package, for example. "Under thick" crests, or indeed layers of correct thickness, thus, do not make good contact with its trace. It is critical that the bottom surface of the crests of all leads, for example the 84 leads in a typical Quad package, are substantially all in the same plane. In addition, excess solder can cause bridging upon board mounting.

Due to the above nonuniform thickness and nonuniform composition problems in solder plating and the difficulties of controlling thickness and composition, one of the world's largest user of these devices (IBM) has specified that a solder dip process be utilized for coating solder on integrated circuit package leads since it was believed that a better, more reliable solder joint between the lead and a solder pad on the printed circuit board would result. Effort has been made to utilize a so-called wave soldering machine in placing a solder coating on J or other type leads by a dip process. In such a machine, a holder of integrated circuit packages, all in a single file end-to-end, is conveyed through a fluxer station, a preheater station and the wave solder station. The wave solder station contains a solder pot, a pump and a nozzle which forms the actual wave of solder through which the holder is passed. Wave soldering machines may be horizontal or inclined, the latter where the conveyor rides up an incline from the flux station to the preheater station to the wave soldering station.

As is known in the field, oil intermix (U.S. Pat. No. 3,098,441) may be used in wave soldering to inhibit dross (oxides of Sn and Pb) formation. It is known that the intermixed oil aids in the post-soldering removal of corrosion causing flux residues. The conventional solder coat process in the past has been to dip or pass the overall package through a solder wave in a leads down orientation.

End users mount and reflow the packages with the resultant dipped solder coated leads onto a board by conveying the chip carriers though a vapor blanket utilizing vaporized FC-70 Fluorinert liquid (3M Co.). Since the melting point of 60Sn-40Pb solder is 185° C., a vapor phase zone of FC-70 at 216° C. is appropriate.

SUMMARY OF THE INVENTION

With respect to soldering Quad 84-leads integrated circuit packages utilizing an ASTRA 16 wave soldering system of Hollis Automation, Inc., it was not possible to meet IBM solder thickness and solder composition specifications by passing the package "pins down" across the solder wave. Resultant tests on leads coated in the "down configuration" indicated many lead crest thicknesses of over 1000 microinches when a mean of 500 microinches was desired. Further evidence indicated that solder icicles or balls extending from the crests and bridging of solder between leads occurred in such processing. Additional testing indicated a wide variance of solder composition on various leads ostensibly subjected to the same solder dip for similar times and temperature. Variations of from 56%Sn to 100%Sn were observed at various lead crests on the same integrated circuit package. It was theorized that as the package left the wave or in the subsequent reflow step, the molten solder flowed from the dip package surfaces by gravity down the lead toward its J or other tips building up a greater variation of solder layer thickness than is desired. Variations in solder composition also resulted.

It has been found that when the circuit packages are conveyed through the wave step and any reflow step while the DIP or J-type leads face upwardly, an "up configuration" with respect to the base of the wave, that specifications on crest thickness and composition were met. Further uniformity of the solder surface, including no dewetting of solder on the leads, with freedom from nodules, blisters, flakes and cracks resulted. Uniformity of solder thickness on the crest area of each lead allowed coplanarity requirements of the customer to be met.

It is theorized that, as the packages leave the solder wave and are reflowed in a subsequent vapor phase zone, the molten solder flows downwardly out under the leads past the plane of the plastic packaging, i.e. the solder flows toward the package and away from the upwardly facing crests rather than flowing off the crest tips away from the package. It is believed that sufficient surface tension is present in the solder to hold the desired thickness of solder on the outer crest surfaces. These surfaces are the point of attachment of the lead to the conductive trace on the printed circuit board as applied in surface-mount technology. It is not overly critical that extra thickness of solder coat is on the noncrest portions of the lead as long as there is no bridging of solder between adjacent leads.

The critical area of a lead is the outer surface of the lead crest which is to be surface mounted connected to a PCB trace. In making the PCB connection, the solder on the J or other type lead, when properly aligned and fluxed, is melted, such that it flows down around the connection forming a miniscus of solder around the newly formed joint. Since outer surfaces of the crests of each lead, processed in the "leads-up" orientation, are all appreciably in the same plane (no highly disparate solder thicknesses) that plane is parallel to the PCB traces or pads on the PCB to which they are to be attached. As a result, each of the simultaneously-made 84 joints in an 84-lead carrier are all within specifications.

The invention may be carried out by preferably mounting a series, typically five, of printed circuit carrier packages in an elongate frame crosswise in a novel pallet which then holds and conveys a series of elongate parallel frames transversely of the solder wave. By such transverse orientation, each package in each elongate frame is contacted at the same time and at the same temperature across the solder wave. If the packages are serially advanced in single file across the wave, each package tends to cool the wave and not be dipped simultaneously, thus, affecting the resulting thickness and composition of the solder coating on the leads.

Lastly, the invention includes optimizing the parameters of a wave soldering machine to aid in achieving the results sought, namely, preventing a wide variation in solder thickness and solder composition particularly at the critical connect-to-trace area of an integrated circuit package lead.

The present invention not only meets a major customer specification requirement, but also reduces manufacturing costs through better yields and meets industry requirements for surface-mounted printed circuit board assembly.

DETAILED DESCRIPTION

Figure 1:
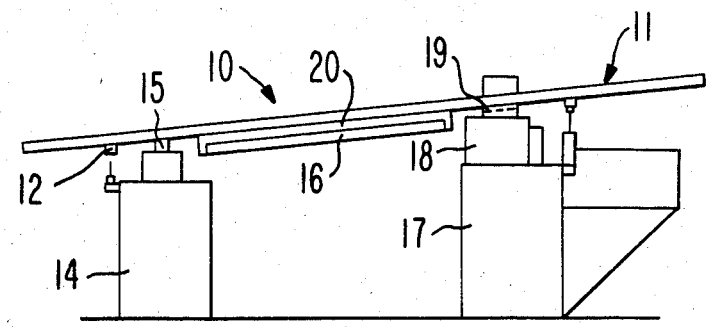
FIG. 1 is a schematic side view of a prior art wave soldering apparatus.
Figure 2:
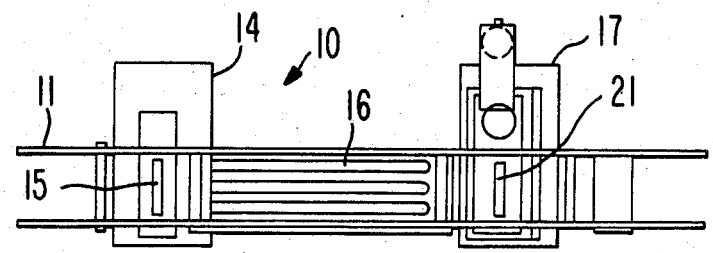
FIG. 2 is a schematic top view of the apparatus of FIG. 1.

FIGS. 1 and 2 schematically illustrate a wave soldering apparatus preferably used in practising the inventions set forth herein. Basically, the apparatus 10 comprises an inclined conveyor 11 for moving a pallet 12 of elongate frames of electronic packages or other electronic parts to receive a coating of solder. The package or parts, first pass above a first station comprising a flux container 14 which includes top baffles and a pump (not shown) to form a fluxing zone 15 above the level of flux in the container. The package leads or parts are thus coated with a flux. The packages or parts continue up the incline of the conveyor through a second station comprising a radiant preheater 16 forming a heating zone 20 to preheat the packages, or parts, and leads to avoid subsequent thermal shock from the application of molten solder. Solder coating occurs at a third station comprising a molten solder container 17 having a solder wave-producing series of baffles and pump 18, as is known in the art, to form a wave 19 of molten solder with intermixed oil above the solder level in the container 17. The packages and leads or other parts pass through the wave. A speed controller on a panel board controls the conveyor speed. The wave is contained by baffles 21 which give the wave a rectangular shape.

In practice, packages or parts are loaded onto a pallet or other fixture holding the parts to the conveyor for transport through the above-described apparatus. An activated water soluble flux (Blackstone 1452) is applied to the package leads in zone 15 using foam fluxer (or wave fluxer) and any excess flux removed by an air knife (not shown). The parts are heated in the preheater zone to evaporate water moisture from the flux solution, afford the flux an opportunity to remove oxides from the surface of the electrical leads and to raise the temperature of the package and leads to minimize thermal shock when they pass through the solder wave. The wave is generated by pumping liquid solder (nominally 60%Sn and 40%Pb) up between baffles 21 to form a wave zone 19. Heretofore, the packages or parts were passed in a leads-down orientation in a serial-in-line progression along the incline of the conveyor through the wave so that basically only the depending leads were below the wave top. Immersion time has generally been from two seconds to three seconds. The fixture holding the series of integrated circuit packages may be dipped in the "leads-down" orientation in the industry accepted prior art wave soldering process to reflow the deposited solder on the leads. This reflow technique is detailed in *Assembly Engineering*, June 1977, in an article by T. Thompson. A Model IL-6 apparatus sold by HTC Inc., Concord, MA, may be employed for performing the reflow step.

Figure 3:
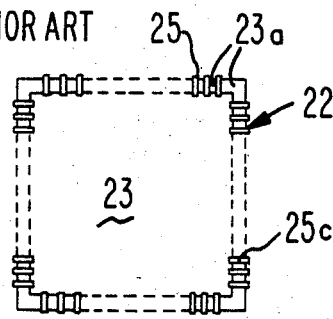
FIG. 3 is a perspective view of a prior art J-leaded integrated circuit package.

FIG. 3 illustrates a typical Quad-type integrated circuit package 22 having a flat surface 23 surrounded by castellated peripheral edge portion 23a between which J-leads 25 are bent and form the J-lead crests 25c. The overall package 22 is subsequently surface-mounted to printed circuit board traces at the crests 25c. Other types of electronic packages such as the "pocket" type where the free end of each lead is bent into a rectangular or other shaped depression or pocket in and around the periphery of package surface 23 may be processed with this invention.

Figure 4:
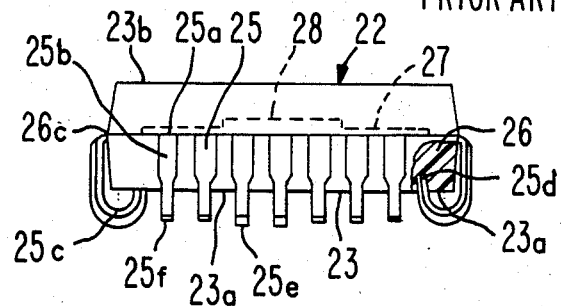
FIG. 4 is a side view of the package of FIG. 3 with one lead and surrounding casing in partial cutaway cross-section.

FIG. 4 illustrates the difficulties which were encountered in the prior art solder coating of the package of FIG. 3 when the solder coating was performed in a Hollis wave soldering machine (ASTRA 16) with the J-leads facing downwardly during and immediately after the solder dip operation. The proximal inner ends 25a of the leads 25 are attached to metallization on a chip lead frame 27 which is wire bonded to the contact pads of an integrated circuit chip 28 inside the package 22. Package 22 is molded or encapsulated with an epoxy resin with lead portion 25a extending from the side edges of the package at the periphery 26c of the package. A downward lead portion 25b is essentially vertical with respect to the horizontal package. The bottom curved portion of the J-lead forms a bottom crest portion 25c, the outer surface of which is eventually to be surface-mounted to a PCB trace and a distal end 25d which abuts or is in a pocket in the package surface 23 between castellations 23a. The crests 25c extend between and exterior of the top of the castellations 23a. Upon "leads down" solder coating, the J-leads crests are coated with a relative wide variance of solder thicknesses. For example, some leads are coated thickly as at 25e, while other leads are much thinner as at 25f. Since it is desired that the coated crests have the exterior surfaces all in the same plane, i.e. planar, it is apparent that the illustrated FIG. 4 package the solder coating would be out-of-specification. As will be shown, the coated crests formed in a "leads down configuration" also have been found to vary extensively in solder composition.

Figure 5:
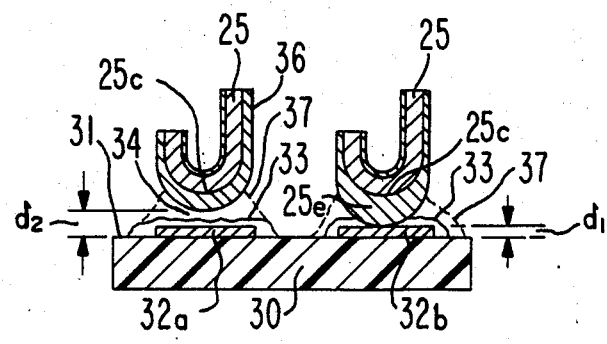
FIG. 5 is a schematic side view of adjacent J-leads and a printed circuit board surface-mount with the adjacent leads rotated 90° for illustrative purposes.

FIG. 5 illustrates the affect of overly thick crest coatings or of icicles or solder balls on the lead crests for the end user. A pair of adjacent J-leads 25 (rotated 90° from their usual orientation with the edge of a package 22) are shown with their crests 25c in a plane parallel to a metal path or traces 32a and 32b on a surface 31 of a printed circuit board 30 to which the leads (and package) are to be surface-mounted. A coating of flux 33 is present over the traces to aid in forming a proper solder connection between lead crest 25c and traces 32a and 32b when the leads are placed in position over the traces for connection. Overthick solder coated crest 25e on the right-hand crest 25c makes first contact with the trace 32b and prevents the adjacent left hand lead crest with its thinner solder coat (and other adjacent lead crests) from making proper contact with the trace 32a. The distance $d_2$ between the bottom of the solder coat on the left lead and the surface 31 is thus greater than the distance $d_1$ between the bottom of the solder coat on the right lead and the surface 31 and a gap 34 is formed between the left-hand crest coated surface and trace 32a. When the leads 25, solder coat 36, adjacent flux 33 and traces 32a and 32b are heated to soldering temperature, the solder 36 on the leads flows downwardly to form a solder miniscus 37 shown by the dotted outline. Due to the noncontacting of the left-hand lead 25, more particularly its coated crest 25c, with trace 32a, an imperfect joint is made therebetween with a high possibility of air and bubble inclusions.

Figure 7:
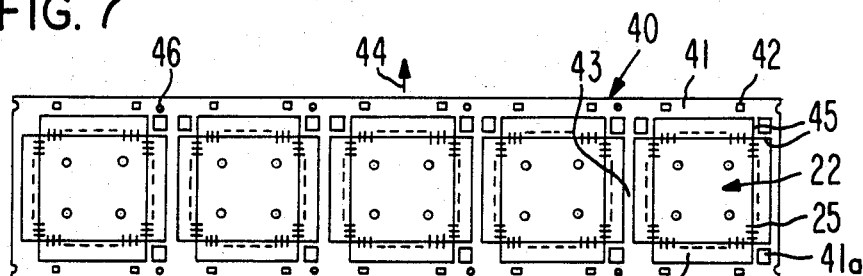
FIG. 7 is a top view of the elongated frame and packages of FIG. 6.
Figure 6:
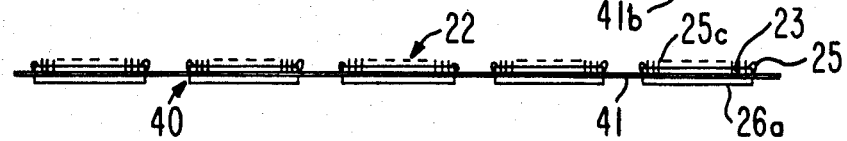
FIG. 6 is a side elevational view of an elongated frame or strip mounting a series of five integrated circuit packages of the J-lead Quad type.
Figure 8:
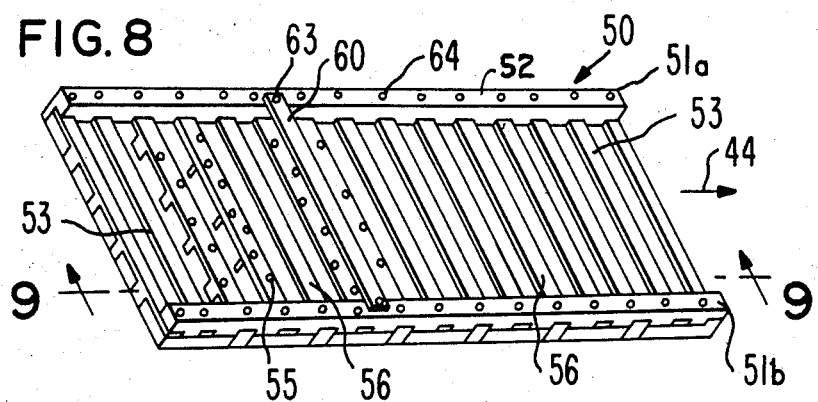
FIG. 8 is a perspective view of a production pallet for mounting multiple parallel series of five package elongate frames.

FIGS. 6 and 7 illustrate the desired orientation of multiple plastic chip carrier and integrated circuit packages 22 when the package leads are to be solder coated by passing a strip of packages through a soldering wave. Each package is attached to an elongated frame or strip 40 having lateral edges 41 with indexing perforations 42 therein for automatic machine handling. As seen in FIG. 8, a pallet mounts the strips and includes a series of short pins 55 extending upwardly from surfaces 56 onto which a strip of packages having side apertures 46 is placed so that the apertures 46 are aligned with and inserted over pins 55 on adjacent bars 53. Each package is held at its corners by connection links or tie-bars 45 extending between the edges 41 and an integral portion of the lead frame strip within the package. After wave soldering the links or tie-bars are severed so that the five packages can be removed from the frame. Cutouts or openings 41a and 41b are provided in the frame.

A feature of this invention is that a group of five or more packages 22, are advanced at one time across a solder wave at a right angle to strip 40 as shown by arrow 44 in FIG. 7. Each of the leads 25 of packages 22 are in a "crests up" orientation. Such orientation when the packages are passed through the wave soldering apparatus (FIGS. 1 and 2) results in even (within specification) coating of the lead crests with a resultant narrow range of solder composition at the lead crest critical area. Each of five packages contact the solder wave simultaneously and creates a minimum change in temperature of the solder across the wave. If the strip 40 is put into the wave lengthwise, each individual package lowers the wave temperature and gives a different coating thickness on different packages.

FIG. 8 illustrates a production pallet which is the preferred best mode of placing and holding the strips 40 for conveyance through the wave soldering machine. The pallet 50 is preferably made from titanium for its lightness, strength and corrosion-resistant properties. Pallet 50 comprises two lengthwise elongate support members or bars 51a and 51b having a top surface 52 and a series of spaced support crossbars 53 between bars 51a and 51b. Each crossbar includes pins 55 as discussed above for holding the apertured adjacent edges of the elongate frames to which the packages (FIGS. 6 and 7) are attached in a "leads up" orientation. The pallet rigidly clamps the frames, allows for simultaneous plating of multiple packages and allows a large number of frames to be supported in a single structure.

As seen in FIG. 8, package support bars 60 (one shown without a strip underneath) extend parallel to and between each of two adjacent crossbars of the pallet and are connected to the bars 51a and 51b of the pallet by suitable fasteners 63 extending through apertures 64 and 64a in the lengthwise bars and support bars, respectively.

Each support bar 60 (FIGS. 9 and 10b) has a series of sets of at least two downwardly extending pins which, when the support bars are assembled over the strips 40, abut each of the topsides of the packages 22 inward of the leads 25 at at least two spaced points 65 and 66 to support each package in the row of the packages 22. The packages and frames are suspended transversely of bars 51a and 51b and extend parallel between crossbars 53. Support bars 60 support each frame and each package so that the frame and package does not bulge upwardly and flex when they and the pallet are passed through the solder wave.

In solder coating operations using the preferred ASTRA 16 machine, the operator first assures that the preheater temperatures are at the desired level. After conveyor start-up, the temperature of the upwardly facing surface of the package is checked. Care must be taken to have the specific gravity of the flux in the flux container kept within the manufacturer's specifications. The following operating parameters of the ASTRA 16 machine have been found to be optimum:

| PARAMETER | STANDARD | OPERATING RANGE | CHECK |
| --- | --- | --- | --- |
| 1. Flux Specific Gravity | 1.129 | ±0.010 | every 4 hrs. |
| 2. Flux Air Pressure - Foam | 1.0 | ±0.1 PSI | |
| 3. Flux Air Pressure - Spray | 1.5 | ±0.1 PSI | |
| 4. Air Knife Pressure | 2.0 | ±0.2 PSI | |
| 5. Temperature @ Preheater | 120° C. | ±5° C. | |
| 6. Package Body Temperature @ solder wave | 180° C. | ±5° C. | |
| 7. Solder Temperature | 255° C. | ±5° C. | |
| 8. Solder Wave Height | 0.4 inch | ±0.5 | |
| 9. Solder Wave Width | 1.7 inch | ±0.3 | |
| 10. Conveyor Speed | 2.5 Ft/Min | ±0.5 Ft/Min. | |
| 11. Conveyor Angle | 6.3° | ±0.3 | |
| 12. Input D.I. Water Flow rate | 2.5 GPM | ±½ GPM | |
| 13. Rinse Water Temperature | 58° C. | ±2° C. | |
| 14. Water Pump Pressure | 28 PSI | ±1 PSI | |
| 15. Conveyor Speed (Cleaner) | 2.5 Ft/Min. | ±0.5 Ft/Min. | |

A wave length of about 16 inches best accommodates the pallet 50 which has a width of 9.85 inches and a length of 15.73 inches. The conveyor speed has been lessened from about 4 ft/min. to about 2.5 ft/min. to lessen the chance of having shorts between leads. This also affords optimum temperature of the solder for proper and optimum solder coating of the lead.

Process development was verified by conducting tests on integrated circuit packages held in a test fixture and passed through a solder wave produced in an ASTRA 16 wave soldering machine with the J-leads in a "leads down" orientation and a "leads up" orientation. 84-lead Quad packages were utilized with data taken on up to 10 leads, i.e. every other, of the 21 leads on each side of the square 84-lead Quad package, i.e. a total of 40 leads. Forty tests were run on one package at the end of the elongate frame of packages and on the middle package of the elongate frame of packages so as to be representative of solder coating conditions across the wave which the elongate frame of packages simultaneously traverse. For example, in test Lot No. 1-1-1 on the center package #3 with the leads facing downwardly on an ASTRA 16 apparatus, the lead crest thicknesses, as measured by x-ray fluorescent techniques, of measured leads varied from 591.9 microinches to over 1000 microinches, At the 1000 microinch point an alarm indicated a gross deviation from a 500 microinches nominal desired thickness for 17 out of the 40 leads measured. The mean thickness of leads actually measured (those under 1000 microinches) was 820.8 microinches. By x-ray fluorescent techniques, it was found that the Sn constituent of the desired 60%Sn and 40%Pb solder varied from 56.6% to 100%Sn. It was clear that the solder coating was not within specifications for thickness, i.e. a range of thickness about 200 to 950 microinches and for composition, i.e. 58-70%Sn.

Figure 9:
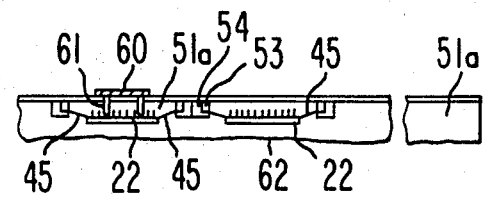
FIG. 9 is a partial side view of the pallet taken on line 9—9 of FIG. 8 showing the packages supported for solder coating in a "leads-up" orientation.
Figure 10A:
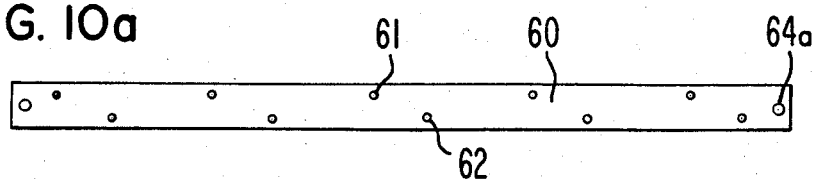
FIG. 10a is a top view of a pallet package-support bar.
Figure 10B:
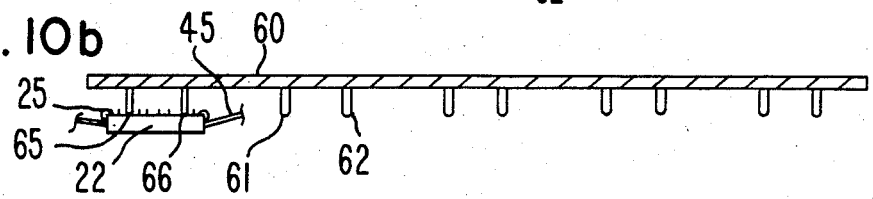
FIG. 10b is a side view of the pallet package-support bar showing its support of a frame-mounted package.

Lot No. 2-1-1 were processed in the ASTRA 16 machine but processed in the "leads up" orientation as shown in FIGS. 6 and 9. The solder coating on the middle package of the group of five packages in an elongate frame in all cases was below 1000 microinches in thickness with a mean thickness for all 40 leads tested of 480.9, very close to the nominal mean of 500 microinches desired. The mean of Sn composition at the crest of all 40 leads was 63.0% Sn with a minimum of 58.5% Sn and a maximum of 69.9% Sn, again within the specifications given above. All of the above percents are in weight percent.

The above description of the preferred embodiment of this invention is intended to be illustrative and not limiting. Other embodiments of this invention will be obvious to those skilled in the art in view of the above disclosure.

I claim:

1. A method of precoating electrical leads extending from a surface of a discrete integrated circuit package having opposed flat top and bottom surfaces and where the electrical leads each have a first portion extending from a peripheral edge of the package and a second portion extending to a position adjacent to one of said top and bottom surfaces of said integrated circuit package, said second portion including a first surface to be precoated with solder for subsequent and separate connection to a printed circuit board comprising:

providing a container having a level of molten solder therein;

intermittently discharging a wave of molten solder in said container above said level of molten solder;

orienting said integrated circuit package with respect to said level of molten solder in a plane intersecting said wave of molten solder;

orienting the said integrated circuit package so that said electrical leads second portion extends in a direction upward and away from said level of molten solder and said first surface to be precoated extends exposed in a plane adjacent to said package; and passing said so-oriented integrated circuit package including said first surface through said wave of molten solder to precoat each of said first surfaces of said electrical leads with essentially uniform thicknesses of solder.

2. The method of claim 1 in which said integrated circuit package is passed through said wave of molten solder along an inclined upward plane.

3. The method of claim 1 further comprising mounting a series of integrated circuit packages in a pallet; and orienting said series of integrated circuit packages in a parallel direction to a crest of said wave of molten solder such that said series of integrated circuit packages simultaneously pass through said wave of molten solder.

4. The method of claim 3 further comprising:

mounting a series of integrated circuit packages in a multiple package frame;

orienting each of the packages in a plane intersecting said wave of molten solder and in a direction upwards and away from level of molten solder; and passing said series of integrated circuit package simultaneously through said wave of molten solder.

5. The method of claim 4 further comprising:
mounting a series of multiple package frames containing integrated circuit packages transversely of an elongated pallet; and
passing said pallet through said wave of molten solder to successively solder coat each electrical lead of each package in each multiple package frame.

* * * * *